United States Patent [19]

Chuang et al.

[11] Patent Number: 4,598,387
[45] Date of Patent: Jul. 1, 1986

[54] CAPACITIVE MEMORY SIGNAL DOUBLER CELL

[75] Inventors: Patrick T. Chuang; George Marr, both of Cupertino, Calif.

[73] Assignee: Advanced Micro Devices, Inc., Sunnyvale, Calif.

[21] Appl. No.: 537,319

[22] Filed: Sep. 29, 1983

[51] Int. Cl.⁴ .............................................. G11C 11/24
[52] U.S. Cl. ..................................... 365/149; 365/205
[58] Field of Search ............... 365/149, 189, 190, 203, 365/205

[56] References Cited

U.S. PATENT DOCUMENTS 4,195,357  3/1980  Kuo et al. .................... 365/205 X
4,413,330  11/1983  Chao et al. .......................... 365/205

Primary Examiner—Joseph A. Popek
Attorney, Agent, or Firm—Patrick T. King; Eugene H. Valet; Robert J. Bennett

[57] ABSTRACT

A plurality of capacitive memory elements are coupled between two pairs of bit line and return line halves. A cross-coupled MOSFET sense amplifier, configured to operate in a race mode, connects between the two bit line/return line pairs. The return line of each bit line/return line pair is coupled to the bit line of the other pair so that when any selected memory element is read to generate a data signal on the bit line half associated with that memory element, the complement of that data signal is coupled to the other bit line half via the return line to increase the signal level differential across the sense amplifier.

10 Claims, 3 Drawing Figures

CAPACITIVE MEMORY SIGNAL DOUBLER CELL

BACKGROUND OF THE INVENTION

The present invention relates generally to memory circuits adapted for implementation in the form of integrated semiconductor circuit chips, and more particularly to metal oxide silicon chip memory arrays using cross-coupled sensing Metal-Oxide-Field Effect Transistors (MOSFETs) connected in a race mode between a bit line and a precharged storage capacitance.

The typical configuration of semiconductor dynamic random access memories (RAMs) is constructed from a plurality of capacitive memory cells arranged to form a memory array in which each of the individual memory cells is capable of being identified by a column (or Y) address and a row (or X) address. As a general rule, for the same number of total bits, the use of more rows and fewer columns increases the complexity of the circuit per bit (due to the need for sensing amplifiers) but decreases the response time and improved sensitivity (due to the reduction of the bit line capacitances as compared to the memory capacitances). Particular arrangements are therefore generally chosen to represent an optimum design compromise.

In any given column the memory cells are arranged in two groups to represent a pair of halves of the total memory cells in that column. Each memory cell is connected to half of a bit line which, in turn, is connected to the gate electrode of one of a cross-coupled pair of MOSFETs that form a sense amplifier circuit. The other half of the bit line is connected to the gate electrode of the other of the MOSFET pair. The sense amplifier circuit takes advantage of the incremental voltage changes on the inherent bit line half capacitances when a memory cell is read to establish a race between the two cross-coupled MOSFETs. The race provides a clear read-out signal regardless of the relative capacitances involved. Examples of such capacitive memory elements and their arrangement can be found described in U.S. Pat. Nos. 3,514,765 and 3,678,473.

Recent advances in semiconductor manufacturing have seen such capacitive memory circuits evolve from a single chip containing 2,048 bits of capacitive memory (arranged, for example, in an array containing 16 rows and 128 columns) to presently commercially available embodiments of semiconductor chips capable of storing 65,536 bits. And, there is a race toward a reliable 256K (262,144) bit memory unit on one chip. Future prospects, the 1,000,000-bit chip, are believed possible.

Notwithstanding these recent (and, according to some, spectacular) advances in semiconductor memory technology, the desire to incorporate more and more functional circuitry on each individual chip, together with the commercial realities of yield, cost, and the like, have caused the semiconductor area available for circuitry to become extremely valuable. Concomitant with semiconductor advances is the development of improved techniques of packing more and more circuitry on smaller and smaller areas of silicon. Thus, when limits in fabrication techniques are encountered, industry focus turns to more efficient circuit design to reduce the component count and, in turn, to reduce the chip area upon which the circuit is formed.

SUMMARY OF THE INVENTION

The present invention is directed to an improved memory cell construction for use in capacitive semiconductor memories of the type that incorporate a sense amplifier formed from a pair of MOSFETs connected in race mode configuration to detect and amplify incremental voltage changes on bit line halves. With very little additional circuitry, the invention provides an improved memory cell capable of generating an increased voltage output when read than heretofore. Thereby, the actual semiconductor area used to form each memory element can be reduced to a point where the memory cell is capable of generating voltage levels (when read) compatible with current sense amplifier design operation.

According to the present invention a sense amplifier of the type having a pair of cross-coupled MOSFETs connected in race mode configuration is connected between a pair of bit line halves. A plurality of capacitive one-bit memory cells are coupled between each bit line half and an associated return line. The return line associated with each bit line half is coupled to the other bit line half.

In operation, an accessed memory cell is read by electrically connecting it across its associated bit and return line halves to create an incremental voltage change on the bit line half indicative of a logic "ONE" or a "ZERO", depending upon the polarity of the voltage change. At the same time, an incremental voltage change of opposite polarity is coupled via the return line half to the other bit line half. In this manner, approximately double the incremental voltage change is impressed across the sense amplifier.

A number of advantages are achieved by the present invention. Flowing from the capability of the invention to produce a larger signal voltage when a particular memory cell is read, is the advantage of requiring less semiconductor area to form the memory cell than that previously required to generate a signal voltage capable of being identified by present-day sense amplifier configuration. This capability of reducing the semiconductor area necessary to form the individual memory cells provides more space for additional circuitry and additional memory cells.

These and other advantages of the present invention will become more apparent upon a reading of the following detailed description of the invention, which should be taken in conjunction with the accompanying drawings.

DETAILED DESCRIPTION OF THE INVENTION

One configuration of semiconductor memory, one that is popularly used today, is in the form of a random access memory (RAM) array in which a plurality of individual, capacitive memory cells are arranged in columns identified by a Y address and rows identified by an X address. Each column consists of a pair of half bit lines coupled to a sense amplifier comprising a pair of cross-coupled MOSFETs. Each bit line half is connected to a corresponding node of the sense amplifier, which functions to amplify incremental voltage changes caused by selectively coupling a memory cell to the bit line when accessed (i.e., read).

Figure 1:
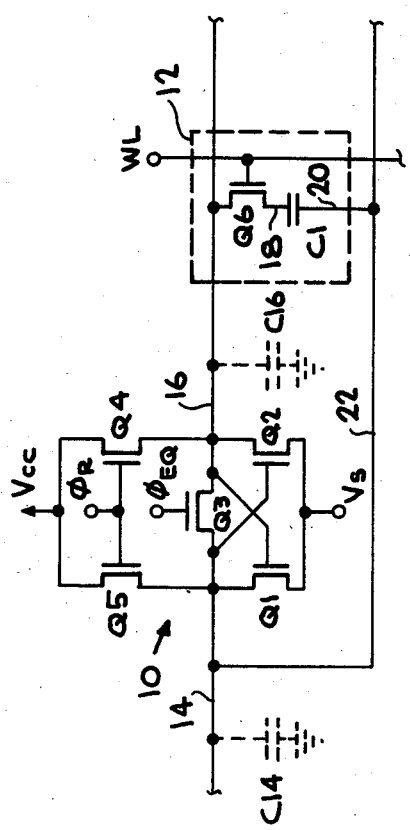
FIG. 1 is a fragmentary circuit diagram, in simplified form, showing this invention and its implementation in a memory circuit utilizing a cross-coupled MOSFET sense amplifier, illustrating the underlying concept of the present invention.

Referring to FIG. 1 the present invention is illustrated in simplified form, showing a sense amplifier, designated generally with the reference numeral 10, and one of a plurality of individual memory cells 12 that would be associated with that sense amplifier. The sense amplifier 10 includes a pair of MOSFETs Q1 and Q2 connected in cross-coupled configuration so that their respective gate electrodes are coupled to the drain electrode of the other transistor Q1, Q2. The gate/drain electrode connections of the transistors Q1 and Q2 form sense nodes. The respective source electrodes of transistors Q1 and Q2 are connected together and to a terminal $V_s$. An equalizing transistor Q3 couples the drain electrodes of each transistor Q1, Q2 together.

Connected to the drain electrode of each transistor Q1, Q2 are bit line halves 14 and 16, respectively. Connected to each bit line half 14, 16 are the memory cells 12. (Again, for purposes of clarity, only one memory cell 12 is shown, and that one is connected to the bit line half 16. It will readily be understood by those skilled in this art that the plurality of memory cells, which memory cell 12 represents, would be connected to both bit line halves, one-half of the memory cells being connected to bit line half 14, the remaining one-half of memory cells being connected to bit line half 16. Taken together, the sense amplifier 10 and bit line halves 14 and 16 (together with the memory cells 12 connected thereto) form one column of the random access memory array).

Connected to the bit line halves 14 and 16 is a restore circuit, comprising transistors Q4 and Q5, which couple the bit lines 14 and 16 to a voltage supply $V_{cc}$; and, associated with each bit line 14, 16, is a bit line capacitance C14 and C16.

The memory cell 12 is illustrated as comprising a gate transistor Q6 and the capacitive memory element C1. Transistor Q6 has its drain electrode connected to the storage terminal of the capacitor C1. The remaining or return terminal 20 of the capacitive element C1 is connected to a return line 22 which, in turn, is connected to the bit line 14.

All the memory cells 12 that are coupled to the bit line half 16 will have the capacitive memory element C1 connected between the bit line half 16 (via a gate transistor Q6) and the return line 22. In similar fashion, the bit line half 14 will have an equal number of memory elements 12 connected between it (the bit line) and a return line (not shown) which, in turn, would be connected to the other bit line half, i.e., bit line half 16.

The circuit illustrated in FIG. 1 would operate as follows: Prior to a read cycle, the bit lines 14 and 16 are precharged to, for example, a value $V_{cc}/2$ by turning on Q3. Assume that the information stored on the memory element C1 is approximately $V_{cc}$, representing a logic "ONE." Since the bit line 14 has been precharged to a voltage $V_{cc}/2$, the return line 22 is at the same value, and before the sensing operation is initiated, the sense terminal $V_s$ is held at $V_{cc}/2$; placing the sense amplifier in a non-operating state.

The memory element 12 is read when the word line (WL) is brought from a "LOW" to a "HIGH" voltage, placing the transistor Q6 in an "ON" or conducting state and coupling the memory element and its stored charge to the bit line half 16. The memory element C1 discharges to the bit line 16, creating an incremental voltage change on the bit line 16 of $\Delta V_{BL}$. As the capacitive memory element C1 discharges to the bit line 16, it will capacitively couple to the return line 22 an incremental voltage that is approximately equal in amplitude but opposite in polarity to $\Delta V_{BL}$. The end result is, therefore, that $2\Delta V_{BL}$ is developed across the sense amp 10, thereby creating, theoretically, twice the usual memory signal.

Thus, when the voltage applied to the sense terminal $V_s$ is dropped to a "LOW" (i.e., something less than $V_{cc}/2$) the sense amplifier 10 is placed in its "race-mode" operating state. Each of the MOSFETs Q1 and Q2 will race to discharge the respective bit line halves connected to the drain electrodes of the MOSFETs Q1 and Q2. When one of the bit line halves 14, 16 reaches a voltage level near the threshold voltage of the MOSFET having its gate electrode connected thereto, that MOSFET ceases conduction. The remaining MOSFET continues conduction to completely discharge the one bit line half, placing the sense amplifier in a "latched" state that can be read to determine the information read from the memory cell 12.

In the present example, if the memory element C1 stored a voltage indicative of a logic "ONE" the beginning of the sense operation would see the bit line half 16 at a higher voltage level than bit line half 14. Starting at a lower voltage level, the bit line half 14 would reach the threshold voltage of MOSFET Q2 before bit line half 16. In fact, the present invention has set bit line half at even a lower starting voltage than will prior art memory configurations of this type by coupling an incremental voltage change, opposite in polarity to that experienced by bit line half 16, to bit line half 14. When the threshold voltage of MOSFET Q2 is reached, MOSFET Q2 ceases conduction; bit line half 14 continues to completely discharge through MOSFET Q1, leaving sense amplifier in a latched, readable state by any presently known method.

Once read, the memory cell is restored by turning on the transistors Q4 and Q5, and leaving the transistor Q6 on. This pulls bit line half 16 toward $V_{cc}$, restoring the charge on memory element C1. Note that during this restore operation the conducting state of the transistor Q1 keeps the bit line half 14 at a LOW voltage. Conversely, the non-conducting state of the transistor Q2 allows the bit line half 14 to be pulled up toward $V_{cc}$, charging the memory element C1 to a full "ONE" voltage. Had a ZERO been read from the memory element 12, the states of the transistors Q1 and Q2 of the sense amplifier 10 would have been reversed, and the memory element C1 would have been left at a LOW voltage—indicative of a ZERO.

The transistors Q4 and Q5 are turned off and the word line WL brought LOW, completing the restore operation.

Figure 2:
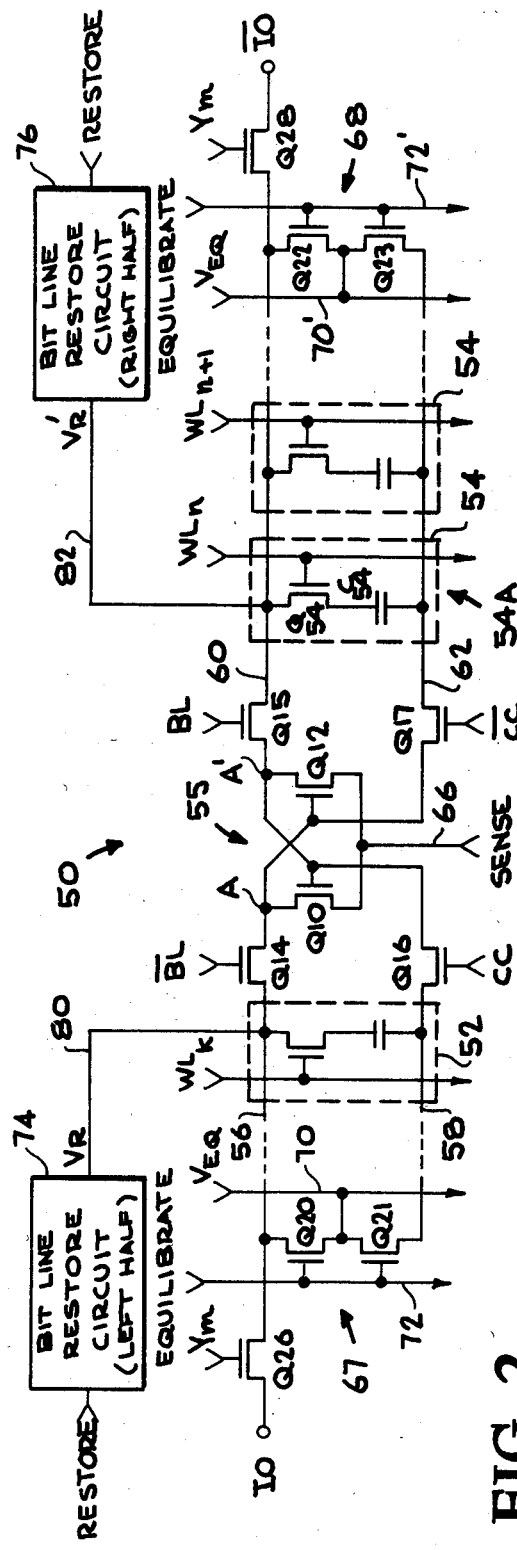
FIG. 2 is a fragmentary circuit diagram of a preferred embodiment of the present invention.

Referring now to FIG. 2, and generally designated with the reference numeral 50, there is illustrated one column of a larger memory array containing M columns and N rows, i.e., M×N bits. Each of the M columns is identically constructed to the column 50 illustrated in FIG. 2. As shown, the column 50 includes memory cells 52 which represent one-half of the total memory cells in the column, the other half of the memory cells in the column 50 being designated with the reference numeral 54. The memory cells 52 (only one of which is shown for clarity) are coupled between a bit line half 56 and a corresponding return line half 58. Similarly, the memory cells 54 are coupled between a bit line half 60 and a return line 62.

A sense amplifier 55, comprising a pair of cross-coupled transistors Q10 and Q12 (transistors Q10 and Q12 are MOSFETs, as are all other transistors discussed herein), forming sense nodes A and A', connects to the bit line halves 56 and 60 by transistor switch element Q14 and Q15, respectively. The gate electrodes of the transistor switch elements Q14 and Q15 are respectively coupled to bit line clock signals $\overline{BL}$ and BL, respectively. The signal $\overline{BL}$ is the complement of the signal BL. The source electrodes of the transistors Q10 and Q12 are connected to signal line 66 to receive a SENSE signal.

In similar fashion, the return lines 58 and 62 are respectively coupled to opposing bit line halves by transistor switch elements Q16 and Q17. The transistor switch elements Q16 and Q17 have their respective gate electrodes connected to receive coupling clock signal CC and its complement $\overline{CC}$.

Coupling each bit line half 56, 60 to its corresponding return line 58, 62 are equalizing circuits 67 and 68, respectively comprising series-connected transistor pairs Q20, Q21 and Q22, Q23. These equalizing circuits function to precharge the bit line halves and corresponding return line halves to which they are connected to a predetermined voltage ($V_{EQ}$). The transistor pair Q20, Q21 that forms the equalizer circuit 67 has the drain electrode of transistor Q20 connected to the bit line half 56, the source electrode of transistor Q21 connected to the return line 58, and the source electrode of transistor Q20 connected to the drain electrode of the transistor Q21, and a signal line 70 that conducts an equalizing reference voltage $V_{EQ}$.

The gate electrodes of each of the transistors Q20, Q21 are connected to a signal line 72 that conducts an EQUILIBRATE signal which, when HIGH, will place the transistors Q20 and Q21 in a conducting state to communicate the $V_{EQ}$ voltage to the bit line half 56 and to the return line half 58, recharging them to the desired level.

The equalizer circuit 68 comprising the transistor pair Q22, Q23 similarly connects the bit line and return line halves 60, 62 to one another, and is configured and functions in the same manner as equalizing circuit 67.

The bit line halves 56 and 60 are respectively coupled to output terminals IO and $\overline{IO}$ by switch transistors elements Q26 and Q28, respectively. Each of the transistors Q26, Q28 have their gate electrodes connected to receive a column select signal ($Y_m$) which functions to turn on each of the transistors and couple the signal then appearing on the corresponding bit line half to the output terminal IO or $\overline{IO}$, as the case may be.

A pair of bit line restore circuits 74 and 76 are respectively coupled to the left and right half bit line half 56, 60 by signal lines 80 and 82. In response to a RESTORE signal, the bit line restore circuits 74 and 76 produce restore voltage signals $V_R$ and $V'_R$ to replenish (i.e., restore) the bit line halves after a read operation. The circuit configuration used to form the bit line restore circuits 74 and 76 may be any of a number of conventional designs. Accordingly, reference to the exact circuit configuration is not described.

The memory cells 52 and 54 are identically constructed and, as illustrated in FIG. 2 by the memory cell 54A, each comprise a series-connected transistor switch Q54 and a capacitive memory element C54.

Figure 3:
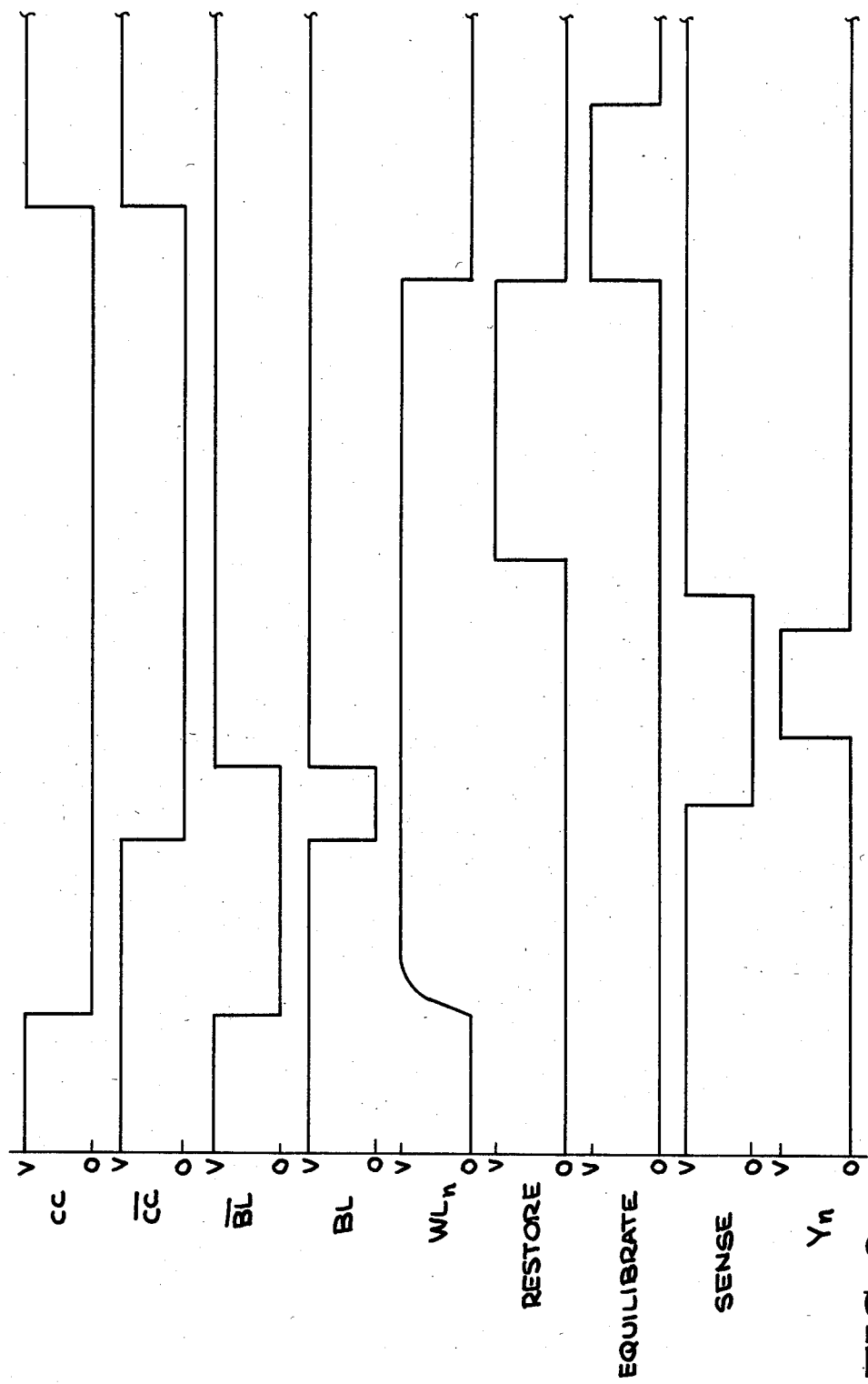
FIG. 3 is a timing diagram for the circuit of FIG. 2.

Referring now to FIGS. 2 and 3, the latter being a timing diagram for a read operation, operation of the present invention will now be described. When the memory element (not shown) of which column 50 forms a part is accessed, the address signals applied to that memory element are decoded to determine which bit line half (right or left) contain the desired bit location. Assume for the purposes of the following discussion that the address applied to the memory unit (not shown) selects the memory cell 54A as one of the selected memory cells. Since the memory cells 52 that are connected to the left half bit line 56 do not participate in the read operation, both the bit line half 56 and its corresponding return line half 58 can be disconnected from the sense amplifier. Accordingly, the read operation begins with the clock signals $\overline{BL}$ and CC dropping to a voltage that causes the transistors Q14 and Q16 to disconnect the bit line half 56 and its corresponding return line half 58 from the sense amplifier. It will be appreciated that there is sufficiently distributed capacitance in the sense amplifier structure and interconnections so that the node A (and node A') has stored a voltage equal in magnitude to that held by the bit line half 56 (or 60, in the case of node A').

Disconnecting the unselected bit and return line halves reduces the capacitive loading caused by the distributed capacitance along the entire bit line and capacitor return lines 56, 58, respectively. It will be appreciated, therefore, that the sense amplifier is thereby capable of operating in a fashion that enhances the sense signal produced.

As FIG. 3 illustrates, the transistors Q15 and Q17 that couple the right bit line and return line halves 60 and 62 to the sense amplifier are kept in conduction by the signals BL and $\overline{CC}$. Thus, the bit line half 60, and its corresponding return line half 62, are electrically connected to the sense amplifier 55 for the read operation.

Next, selection of the cell 54A is made by causing the word line signal ($WL_n$) to go to a HIGH, turning on the transistor Q54 of the cell 54A and connecting the capacitive memory element C54 to the bit line half 60. Assume, for the moment, that the capacitive memory element C54 is charged to a HIGH voltage (as distinguished from a near-zero voltage), representing for example a logic ONE. When the transistor Q54 conducts, the charge on the memory capacitance C54 will discharge to the bit line half 60, raising the overall voltage appearing at the node A' of the sense amplifier, relative to the left node A. Alternatively, if the memory capacitance C54 is charged to a lesser voltage representing, for example, a logic ZERO, the bit line half 60 would discharge to the memory capacitance C54, causing the voltage at the sense amplifier node A' to decrease, relative to the sense amplifier node A.

Thus, when the capacitive memory element C54 is electrically connected to the bit line half 60 an incremental voltage change is experienced by the bit line half 60 (and the sense amplifier node A'). At the same time a similar incremental voltage change, nearly equal in magnitude but opposite in polarity, is coupled to the return line half 62 and to the sense amplifier node A via the transistor Q17.

The sense amplifier, during the initial read period so far described, is held in a non-operative state by the SENSE signal, which will be at a voltage level sufficient to keep the cross-coupled transistors Q10 and Q12 in a non-conducting state. Selection of memory cell 54 and the resultant incremental voltage change ($\Delta V$) results in bringing node A' of sense amplifier 55 to a voltage $V_{EQ}+\Delta V$, while node A is placed at approximately $V_{EQ}-\Delta V$ (the incremental voltage $\Delta V$ being positive or negative—depending upon the charge placed on the capacitive memory element C54). Thus, the voltage across the sense amplifier 55 is $(V_{EQ}+\Delta V)-(V_{EQ}-\Delta V)$ or $2\Delta V$.

After the voltage at the sense amplifier nodes A and A' have more or less settled, the signals BL and $\overline{CC}$ experience a negative transition from a HIGH to a LOW, causing the transistors Q15 and Q17 to disconnect, respectively, the bit line half and return line half 60 and 62 from the sense amplifier 55. The SENSE signal then goes LOW, placing the transistors Q10 and Q12 in conduction. The sense amplifier is now in its conventional "race" mode: The transistors Q10 and Q12 "race" to discharge the respective sense amplifier nodes A' and A. The particular node that starts at a lower voltage, in the example under consideration here, node A, will reach the threshold voltage $V_{th}$ first. When this occurs, the transistor whose gate electrode is connected to that node (i.e., transistor Q12) will cease conduction. The opposing transistor (Q10) continues to conduct until the node A is fully discharged.

Immediately thereafter, as FIG. 3 illustrates, the BL and $\overline{BL}$ clock signals turn on the transistors Q14 and Q15 to connect the sense amplifier nodes A and A' to the bit line halves 56 and 60, respectively. At the same time, the column gate signals $Y_N$ turn on the switch transistors Q26 and Q28 to gate the sense amplifier 55 to the output terminals IO and $\overline{IO}$.

The column signal $Y_M$, after sufficient time, terminates, disconnecting the bit line halves 56 and 60 from the IO and $\overline{IO}$ output terminals. The RESTORE clock is applied to the bit line restore circuits 74 and 76. The bit line restore circuits 74 and 76 are designed to perform dynamic restores; that is, they are capable of sensing the bit line halves to which they are attached and of determining whether a HIGH (indicating that a logic ONE was read from the accessed memory cell) or a LOW (indicating a logic ZERO was read from the memory cell) voltage is present on the bit line half being considered and perform a restore operation accordingly.

Thus, in the present example, the bit line restore circuit 76 will be activated, and the bit line restore circuit 74 will remain inactive. The bit line half 60, during this period of time, will be at one of two voltage levels: If a voltage HIGH had been stored on the capacitive memory element C54, the bit line half 60 will be at a higher voltage level than it would have been if a ZERO had been read from the memory capacitance C54. Sensing this higher voltage, the bit line restore circuit 76 issues a voltage $V'_R$ to pull the bit line half 60 toward $V_{CC}$, restoring the charge to the memory capacitance C54 to the voltage level necessary.

If, on the other hand, a ZERO had been read from the memory capacitance C54, the bit line half 60 would have been at a LOW voltage. Accordingly, the bit line restore circuit 76, sensing this ZERO, would have remained inactive. Throughout this period of time the bit line restore circuit 74 remains inactive.

The RESTORE signal then terminates, disabling the bit line restore circuits 74 and 76. At the same time, the word line signal $WL_n$ also terminates.

Then, EQUILIBRATE signal goes HIGH to place the transistors Q20 and Q21 (for the right half of the circuitry) and the transistors Q22 and Q23 (for the left half of the circuitry) in conducting states. This connects the bit line halves 56 and 60 to their corresponding return line halves 58 and 62 to a voltage level $V_{EQ}$. In this manner, the bit line and capacitive return line halves are equalized at the same voltage level and readied for the next read or write operation.

We claim:

1. A read-write capacitive memory circuit, comprising:
    a plurality of capacitive memory elements each coupled between one-half of a halved bit line and a corresponding one-half of a halved return line;
    cross-coupled sense amplifier means arranged to operate in a race mode between the two bit line halves; and
    means for coupling the return line half corresponding to a one of the two bit line halves to the other of the two bit line halves.

2. A read-write memory circuit, comprising:
    a plurality of capacitive memory elements each coupled between one-half of a halved bit line/return line pair, the one-half return line of each pair being coupled to the halved bit line of the other pair; and
    cross-coupled sense amplifier means arranged to operate in a race mode between the two bit line halves.

3. A memory circuit, comprising:
    a plurality of memory elements each connected to one-half of a halved bit line;
    sense amplifier means, including a pair of cross-coupled MOSFETs forming first and second sense nodes that are respectively coupled to a corresponding one of the bit line halves, the pair of MOSFETs being arranged to operate in a race mode between the two bit line halves; and
    first means for selectively coupling the memory elements of each bit line half to the opposite sense node.

4. The memory circuit of claim 3, the first means including a switch transistor and a return line associated with each bit line half, the memory elements of each bit line half being connected between the associated bit line and return line halves, each switch transistor being operably connected to the return lines to a corresponding one of the sense nodes.

5. The memory circuit of claim 4, including equalizing means for setting the bit line halves and the return line halves at substantially a same voltage level.

6. The memory circuit of claim 5, wherein the equalizing means includes a pair of MOSFET transistors coupled in series between each bit line half and associated return line half.

7. The memory circuit of claim 3, wherein each MOSFET of the pair of cross-coupled MOSFETs includes a gate electrode and a source electrode respectively connected to the source electrode and the gate electrode of the other of the pair of cross-coupled MOSFETs.

8. The memory circuit of claim 7, wherein the respective connection of the gate and source electrodes each forms the first and second sense nodes.

9. The memory circuit of claim 3, including means for selectively coupling the bit line halves to the sense amplifier means.

10. A semiconductor memory circuit, comprising:
    a pair of bit lines;
    a pair of return lines, each return line being associated with one of the bit lines;

a plurality of capacitive memory elements coupled between each of the bit lines and its associated return line; and sense amplifier means, including a pair of MOSFETs each having their respective gate and source electrodes cross-coupled to one another forming a pair of sense nodes, the bit lines each being coupled to a one of the sense nodes and the return lines associated with each bit line being coupled to the opposite one of the sense nodes.

* * * * *